(12) United States Patent
Kim et al.

(10) Patent No.: US 9,620,661 B2
(45) Date of Patent: Apr. 11, 2017

(54) LASER BEAM SHAPING FOR FOIL-BASED METALLIZATION OF SOLAR CELLS

(71) Applicants: Taeseok Kim, San Jose, CA (US); Gabriel Harley, Mountain View, CA (US); John Wade Viatella, Los Gatos, CA (US); Perine Jaffrennou, San Francisco, CA (US)

(72) Inventors: Taeseok Kim, San Jose, CA (US); Gabriel Harley, Mountain View, CA (US); John Wade Viatella, Los Gatos, CA (US); Perine Jaffrennou, San Francisco, CA (US)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 106 days.

(21) Appl. No.: 14/578,334

(22) Filed: Dec. 19, 2014

(65) Prior Publication Data

US 2016/0181447 A1 Jun. 23, 2016

(51) Int. Cl.
*H01L 31/0224* (2006.01)
*H01L 31/0745* (2012.01)

(52) U.S. Cl.
CPC .. *H01L 31/0745* (2013.01); *H01L 31/022441* (2013.01)

(58) Field of Classification Search
CPC ........ H01L 31/02–31/208; H01L 31/18; H01L 31/182; H01L 31/022441; H01L 31/02245; H01L 31/022458; H01L 21/0275; H01L 2021/60112; H01L 2021/60292; H01L 21/76894
See application file for complete search history.

(56) References Cited

U.S. PATENT DOCUMENTS

| | | | |
|---|---|---|---|
| 2008/0216887 A1 | 9/2008 | Hacke et al. | |
| 2008/0289683 A1* | 11/2008 | Walsh | H01L 31/0465 136/255 |
| 2012/0204938 A1 | 8/2012 | Hacke et al. | |
| 2015/0004737 A1* | 1/2015 | Harley | H01L 31/048 438/64 |
| 2015/0090329 A1* | 4/2015 | Pass | H01L 31/022441 136/256 |

(Continued)

OTHER PUBLICATIONS

Harley, Gabriel et al., U.S. Appl. No. 14/229,716, filed Mar. 28, 2014, entitled "Foil-Based Metallization of Solar Cells," 46 pgs.

*Primary Examiner* — Kevin Parendo
(74) *Attorney, Agent, or Firm* — Blakely Sokoloff Taylor Zafman LLP

(57) ABSTRACT

Approaches for foil-based metallization of solar cells and the resulting solar cells are described. For example, a method of fabricating a solar cell involves locating a metal foil above a plurality of alternating N-type and P-type semiconductor regions disposed in or above a substrate. The method also involves laser welding the metal foil to the alternating N-type and P-type semiconductor regions. The method also involves patterning the metal foil by laser ablating through at least a portion of the metal foil at regions in alignment with locations between the alternating N-type and P-type semiconductor regions. The laser welding and the patterning are performed at the same time.

18 Claims, 10 Drawing Sheets

(56) References Cited

U.S. PATENT DOCUMENTS

| | | | | |
|---|---|---|---|---|
| 2015/0179865 A1* | 6/2015 | Moors | H01L 31/18 | |
| | | | 438/98 | |
| 2015/0179870 A1* | 6/2015 | Moors | H01L 31/02167 | |
| | | | 438/98 | |
| 2015/0280021 A1* | 10/2015 | Harley | H01L 31/022441 | |
| | | | 136/255 | |
| 2015/0280027 A1* | 10/2015 | Moors | H01L 31/022441 | |
| | | | 136/256 | |
| 2015/0380577 A1* | 12/2015 | Loscutoff | H01B 1/20 | |
| | | | 136/256 | |
| 2016/0163901 A1* | 6/2016 | Hsia | H01L 31/022441 | |
| | | | 136/249 | |
| 2016/0284885 A1* | 9/2016 | Westerberg | H01L 31/02363 | |

* cited by examiner

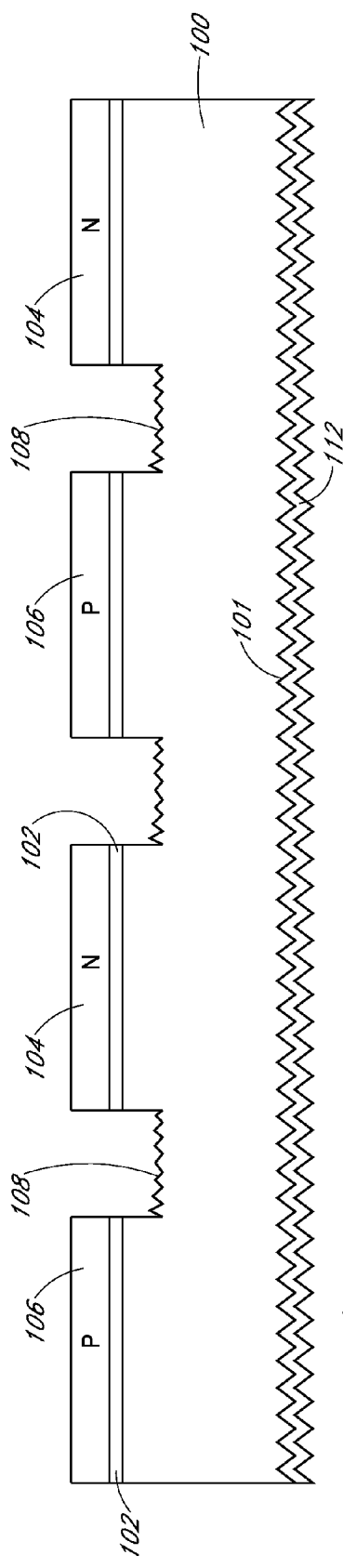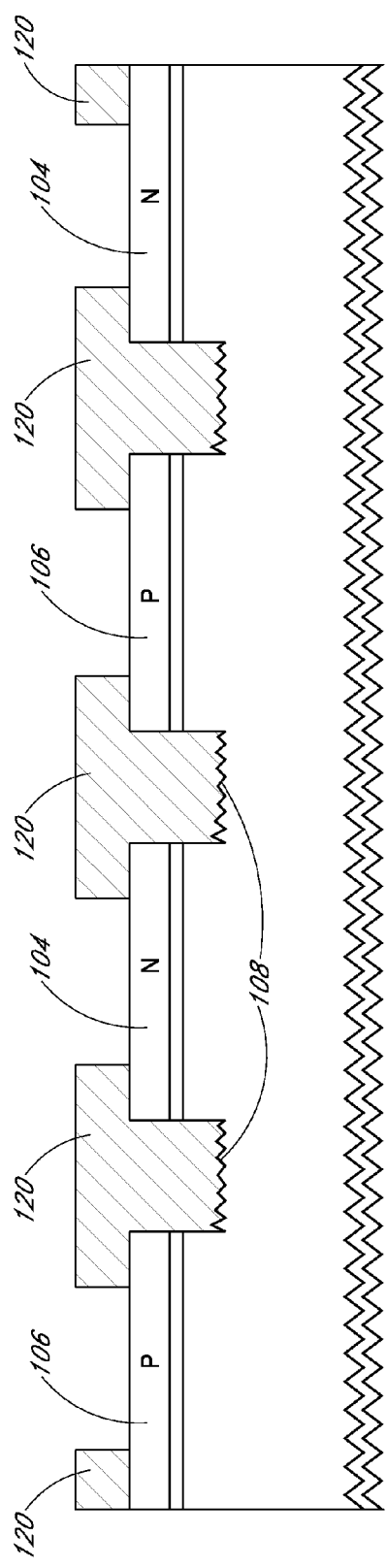

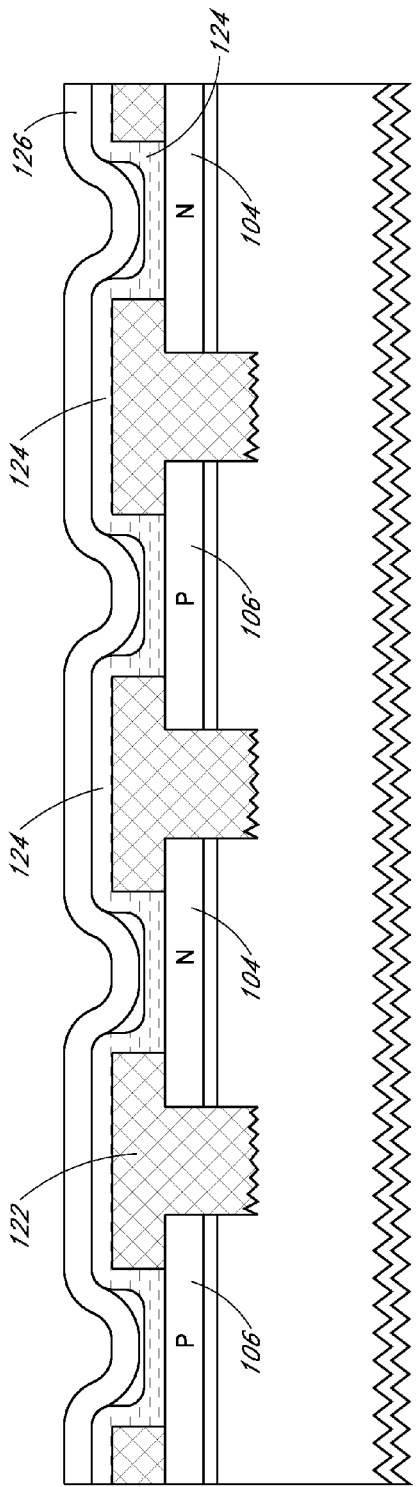
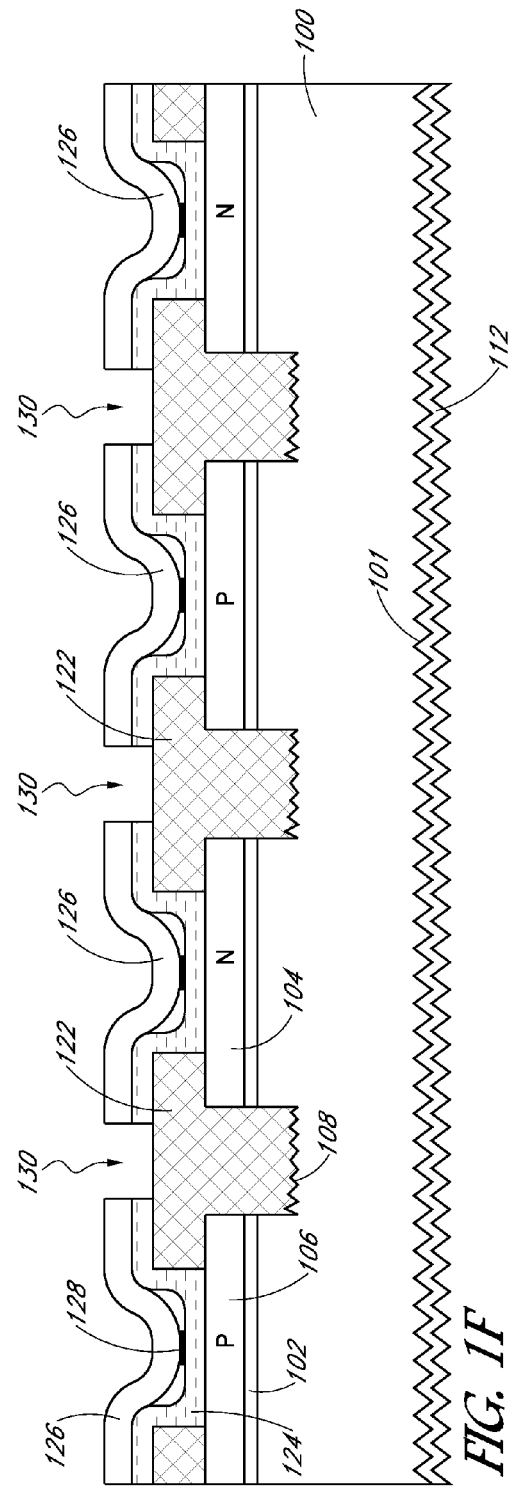

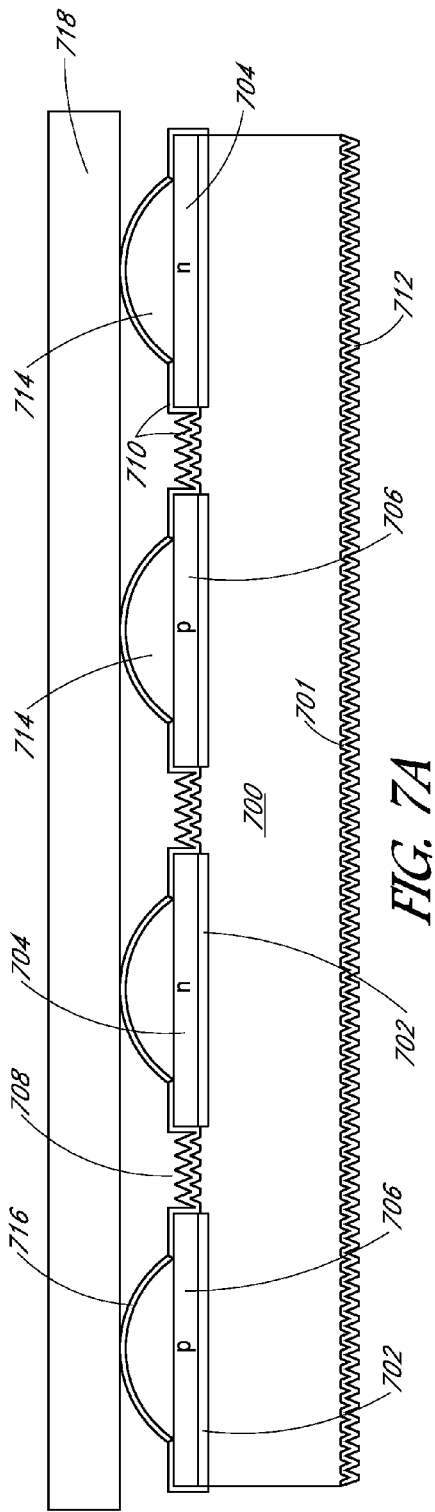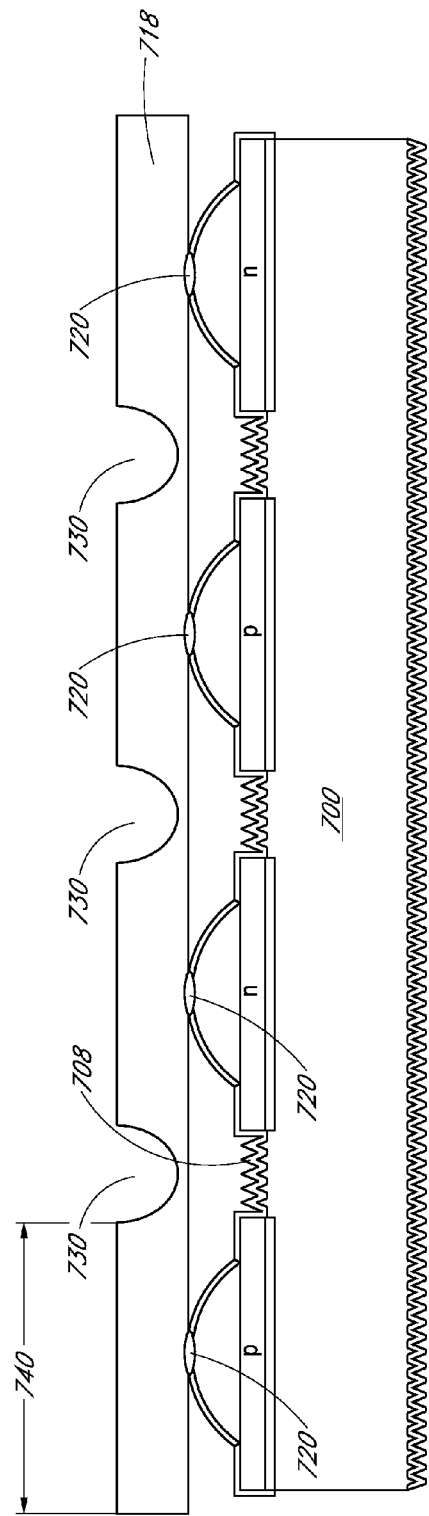

LASER BEAM SHAPING FOR FOIL-BASED METALLIZATION OF SOLAR CELLS

TECHNICAL FIELD

Embodiments of the present disclosure are in the field of renewable energy and, in particular, include approaches for foil-based metallization of solar cells and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIGS. 1A-1F illustrate cross-sectional views of various stages in the fabrication of a solar cell using foil-based metallization, in accordance with an embodiment of the present disclosure, wherein:

FIG. 1A illustrates a stage in solar cell fabrication following formation of alternating N-type and P-type semiconductor regions (emitter regions) formed above a portion of a back surface of a substrate of a solar cell;

FIG. 1B illustrates the structure of FIG. 1A following optional formation of a paste between adjacent ones of the alternating N-type and P-type semiconductor regions;

FIG. 1C illustrates the structure of FIG. 1B following optional curing of the paste to form non-conductive material regions in alignment with locations between the alternating N-type and P-type semiconductor regions;

FIG. 1D illustrates the structure of FIG. 1C following optional formation of a plurality of metal seed material regions to provide a metal seed material region on each of the alternating N-type and P-type semiconductor regions;

FIG. 1E illustrates the structure of FIG. 1D following locating of a metal foil with the alternating N-type and P-type semiconductor regions; and FIG. 1F illustrates the structure of FIG. 1E following laser ablating through the metal foil in alignment with the locations between the alternating N-type and P-type semiconductor regions to laser weld the metal foil with the alternating N-type and P-type semiconductor regions and to isolate regions of remaining metal foil in alignment with the alternating N-type and P-type semiconductor regions.

FIGS. 7A and 7B illustrate cross-sectional views of various stages in the fabrication of a solar cell using foil-based metallization, in accordance with another embodiment of the present disclosure.

DETAILED DESCRIPTION

Figure 1C:
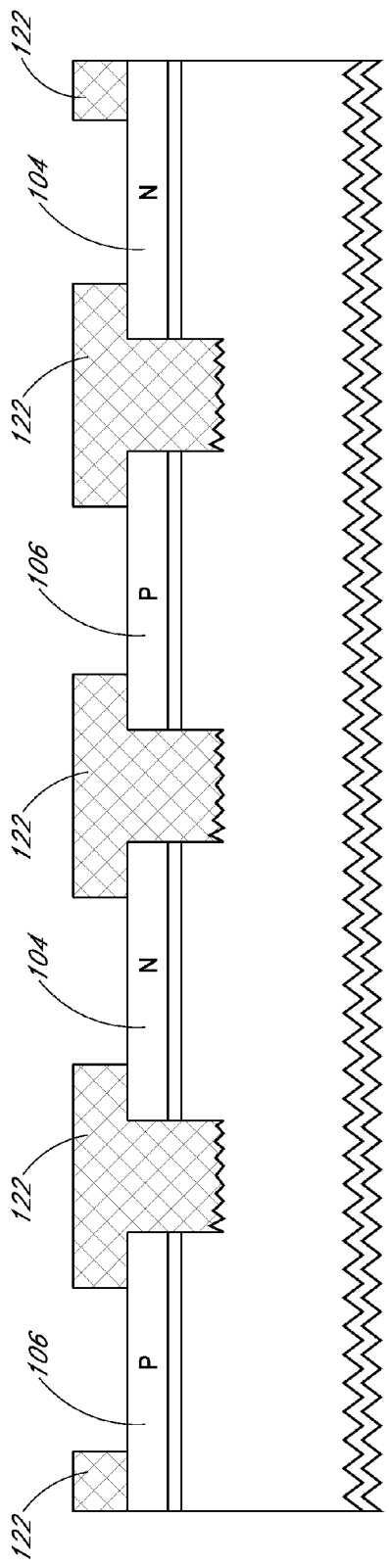

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Approaches for foil-based metallization of solar cells and the resulting solar cells are described herein. In the following description, numerous specific details are set forth, such as specific laser spatial profiles and process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells, and the resulting solar cells. In one embodiment, a method of fabricating a solar cell involves locating a metal foil above a plurality of alternating N-type and P-type semiconductor regions disposed in or above a substrate. The method also involves laser welding the metal foil to the alternating N-type and P-type semiconductor regions. The method also involves patterning the metal foil by laser ablating through at least a portion of the metal foil at regions in alignment with locations between the alternating N-type and P-type semiconductor regions. The laser welding and the patterning are performed at the same time.

In another embodiment, a method of fabricating a solar cell involves locating a metal foil above a plurality of alternating N-type and P-type semiconductor regions disposed in or above a substrate. The method also involves impinging an incident laser beam on the metal foil, the incident laser beam having a beam shape with an inner region of lower intensity and an outer region of higher intensity, the inner region and the outer region relative to a central axis of the incident laser beam. The method also involves laser welding the metal foil to the alternating N-type and P-type semiconductor regions with the inner region of the incident laser beam. The method also involves patterning the metal foil by laser ablating with the outer region of the incident laser beam through at least a portion of the metal foil at regions in alignment with locations between the alternating N-type and P-type semiconductor regions.

In another embodiment, a method of fabricating a solar cell involves locating a metal foil above a plurality of alternating N-type and P-type semiconductor regions disposed in or above a substrate. The method also involves impinging an incident laser beam on the metal foil, the incident laser beam having a beam shape with an inner region of higher intensity and an outer region of lower intensity, the inner region and the outer region relative to a central axis of the incident laser beam. The method also involves laser welding the metal foil to the alternating N-type and P-type semiconductor regions with the outer region of the incident laser beam. The method also involves patterning the metal foil by laser ablating with the inner region of the incident laser beam through at least a portion of the metal foil at regions in alignment with locations between the alternating N-type and P-type semiconductor regions.

One or more embodiments described herein are directed to metal (such as aluminum) based metallization for solar cells. As a general consideration, back contact solar cells typically require patterned metal of two types of polarity on the backside of the solar cell. Where pre-patterned metal is not available due to cost, complexity, or efficiency reasons, low cost, low materials processing of a blanket metal often favors laser-based pattern approaches. In an embodiment, an aluminum metallization process for interdigitated back contact (IBC) solar cells is disclosed. In an embodiment, a M2-M1 process is referenced, where the M2 layer may be fabricated from a metal foil, while the M1 layer is a metal layer (which may be referred to as a seed layer) formed on a portion of a solar cell.

To provide context, in applying a foil based metallization for the backside junction of a solar cell, it may be challenging to fabricate a finger (contacts) pattern from the foil whether before or after an associated conduction bonding between the cell and the foil. One patterning attempted involved using a pulsed laser to ablate the foil in between two different polarity fingers until they were electrically isolated. However, such "direct laser patterning" has shown little processing window advantages. There have also been attempts to introduce damage absorbing layers between the M2 and the cell during the patterning, or the use of ablating the majority thickness of the foil and using chemical etching for the complete electrical isolation, but advances in patterning technology are still needed. In one or more embodiments described herein, laser induced damage is avoided during patterning, and a number of laser exposure operations may be reduced.

Accordingly, embodiments described herein provide one or more approaches for patterning a major current carrying layer, or M2, during a laser welding operation using a spatially shaped beam profile. In one embodiment, a fabrication process involves laser bonding and mechanical foil isolation operations to minimize thermal and optical damage during a patterning operation while allowing high accuracy of alignment between the bonding and the patterning.

In an embodiment, different strengths of adhesion among foil (M2) bonded to a vapor deposited thin seed metal (M1) and, hence, to the underlying device wafer, are achieved depending on bonding method. Furthermore, different types of failure modes are observed during adhesion testing. For laser bonding, adhesion can depend on the laser fluence (energy per focused area). At lower fluences, the adhesion between M1 and M2 is too weak and the M2 detaches easily. As the laser fluence increases, the adhesion by the welding between the foil and the underlying M1 seed layer becomes strong enough to tear the foil during the adhesion test. When the laser fluence becomes even higher, the underlying M1 layer becomes affected and the M1-device wafer bonding is broken before the foil is torn off in a peeling test. To take advantage of such different modes of tearing, in one embodiment, a spatially shaped laser beam is used during the laser bonding process. The laser beam can have higher intensity (M1 tearing range) at the outer region and lower intensity (M2 tearing range) on the inside, such that after the welding, the foil (M2) can be torn off along with the M1, while leaving the M2/M1 region under the weld intact.

In an illustrative example of processing that may benefit from a spatially shaped maser beam process, a laser grooving and laser welding approach provides a new electrode patterning method for interdigitated back contact solar cells based on the laser patterning and welding of an aluminum (Al) foil to form an inter-digitated pattern of contact fingers. Embodiments of such an approach can be implemented to provide a damage-free method to patterning and welding an Al foil on the wafer, avoiding complex alignment and/or masking processes. As an example, FIGS. 1A-1F illustrate cross-sectional views of various stages in the fabrication of a solar cell using foil-based metallization, in accordance with an embodiment of the present disclosure. FIG. 2 is a flowchart listing operations in a method of fabricating a solar cell as corresponding at least to some of FIGS. 1A-1F, in accordance with an embodiment of the present disclosure.

FIG. 1A illustrates a stage in solar cell fabrication following formation of emitter regions formed above a portion of a back surface of a substrate of a solar cell. Referring to FIG. 1A and corresponding to a portion of operation 202 of flowchart 200, a plurality of alternating N-type and P-type semiconductor regions are formed above a substrate. In particular, a substrate 100 has disposed there above N-type semiconductor regions 104 and P-type semiconductor regions 106 disposed on a thin dielectric material 102 as an intervening material between the N-type semiconductor regions 104 or P-type semiconductor regions 106, respectively, and the substrate 100. The substrate 100 has a light-receiving surface 101 opposite a back surface above which the N-type semiconductor regions 104 and P-type semiconductor regions 106 are formed.

In an embodiment, the substrate 100 is a monocrystalline silicon substrate, such as a bulk single crystalline N-type doped silicon substrate. It is to be appreciated, however, that substrate 100 may be a layer, such as a multi-crystalline silicon layer, disposed on a global solar cell substrate. In an embodiment, the thin dielectric layer 102 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer. In other embodiments, N-type and P-type emitter regions are formed in the substrate itself, in which case distinct semiconductor regions (such as regions 104 and 106) and the dielectric layer 102 would not be included.

In an embodiment, the alternating N-type and P-type semiconductor regions 104 and 106, respectively, are formed polycrystalline silicon formed by, e.g., using a plasma-enhanced chemical vapor deposition (PECVD) process. In one such embodiment, the N-type polycrystalline silicon emitter regions 104 are doped with an N-type impurity, such as phosphorus. The P-type polycrystalline silicon emitter regions 106 are doped with a P-type impurity, such as boron. As is depicted in FIG. 1A, the alternating N-type and P-type semiconductor regions 104 and 106 may have trenches 108 formed there between, the trenches 108 extending partially into the substrate 100. Additionally, although not depicted, in one embodiment, a bottom anti-reflective coating (BARC) material or other protective layer (such as a layer amorphous silicon) is formed on the alternating N-type and P-type semiconductor regions 104 and 106.

In an embodiment, the light receiving surface 101 is a texturized light-receiving surface, as is depicted in FIG. 1A. In one embodiment, a hydroxide-based wet etchant is employed to texturize the light receiving surface 101 of the substrate 100 and, possibly, the trench 108 surfaces as is also depicted in FIG. 1A. It is to be appreciated that the timing of the texturizing of the light receiving surface may vary. For example, the texturizing may be performed before or after the formation of the thin dielectric layer 102. In an embodiment, a texturized surface may be one which has a regular or an irregular shaped surface for scattering incoming light, decreasing the amount of light reflected off of the light receiving surface 101 of the solar cell. Referring again to FIG. 1A, additional embodiments can include formation of a passivation and/or anti-reflective coating (ARC) layers (shown collectively as layer 112) on the light-receiving surface 101. It is to be appreciated that the timing of the formation of passivation and/or ARC layers may also vary.

FIG. 1B illustrates a stage in solar cell fabrication following optional formation of a paste between adjacent ones of the alternating N-type and P-type semiconductor regions. Referring to FIG. 1B, regions of a paste material 120 are formed between adjacent ones of the alternating N-type and P-type semiconductor regions 104 and 106. In embodiments where trenches 108 have been formed, the paste 120 is formed within the trenches 108, as is depicted in FIG. 1B.

In an embodiment, the regions of the paste material 120 are formed by screen printing the paste. In one such embodiment, the screen printing permits forming the regions of the paste material 120 in a pattern that leaves exposed surfaces of the alternating N-type and P-type semiconductor regions 104 and 106, as is depicted in FIG. 1B. In an embodiment, the regions of the paste material 120 are formed from a paste suitable for forming a non-conductive region of a solar cell. In one such embodiment, the paste includes a binder, an opacifying pigment, and an organic medium mixed with the binder and the opacifying pigment. In an embodiment, with reference again to the paste 120, the paste has a cure temperature of or less than approximately 450 degrees Celsius.

Figure 2:
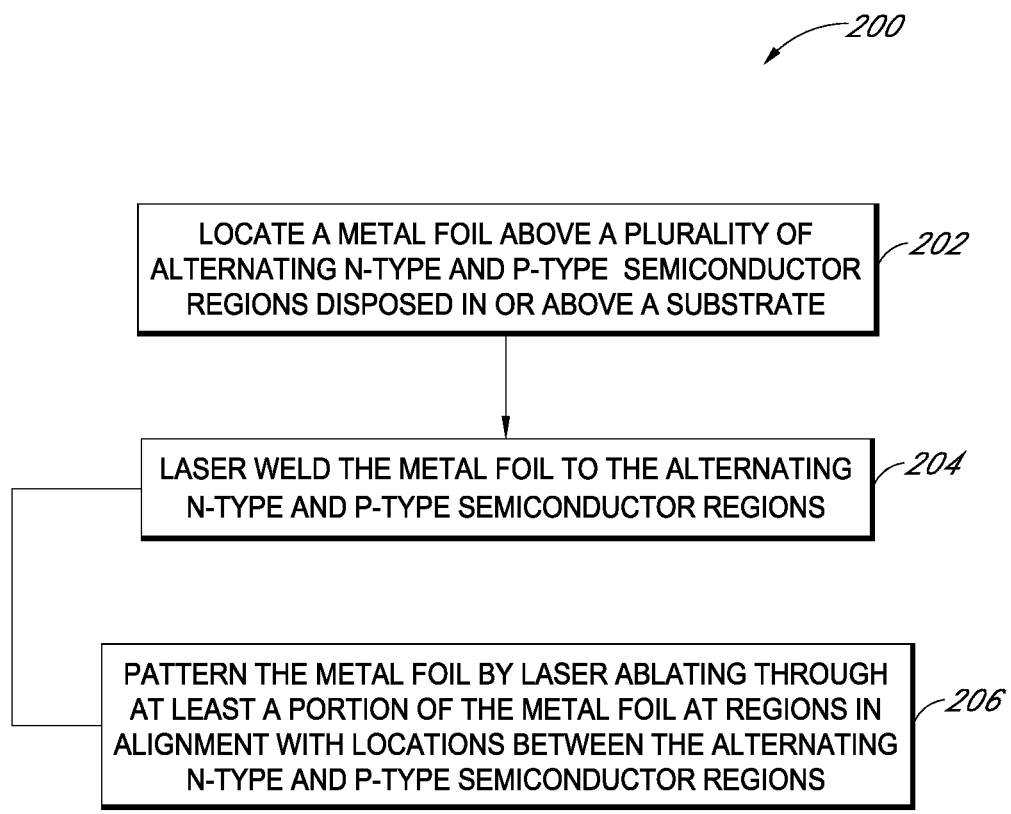
FIG. 2 is a flowchart listing operations in a method of fabricating a solar cell as corresponding to FIGS. 1A-1F, in accordance with an embodiment of the present disclosure.

FIG. 1C illustrates a stage in solar cell fabrication following optional curing of the paste. Referring to FIG. 1C, the regions of paste material 120 are cured to form non-conductive material regions 122 in alignment with locations between the alternating N-type and P-type semiconductor regions.

In an embodiment, curing the paste 120 to form the non-conductive material regions 122 involves heating the paste but limited to a temperature of or less than approximately 450 degrees Celsius. In another embodiment, curing the paste 120 to form the non-conductive material regions 122 involves exposing to ultra-violet (UV) radiation, or a combination of heating and exposing to UV radiation. In an embodiment, upon curing, substantially all of the organic medium of the paste is removed, while substantially all of the binder and the opacifying pigment of the paste are retained. In one such embodiment, the binder of the paste is an inorganic binder, and the curing involves converting the inorganic binder to a rigid inorganic matrix of the non-conductive material regions 122.

Figure 1D:
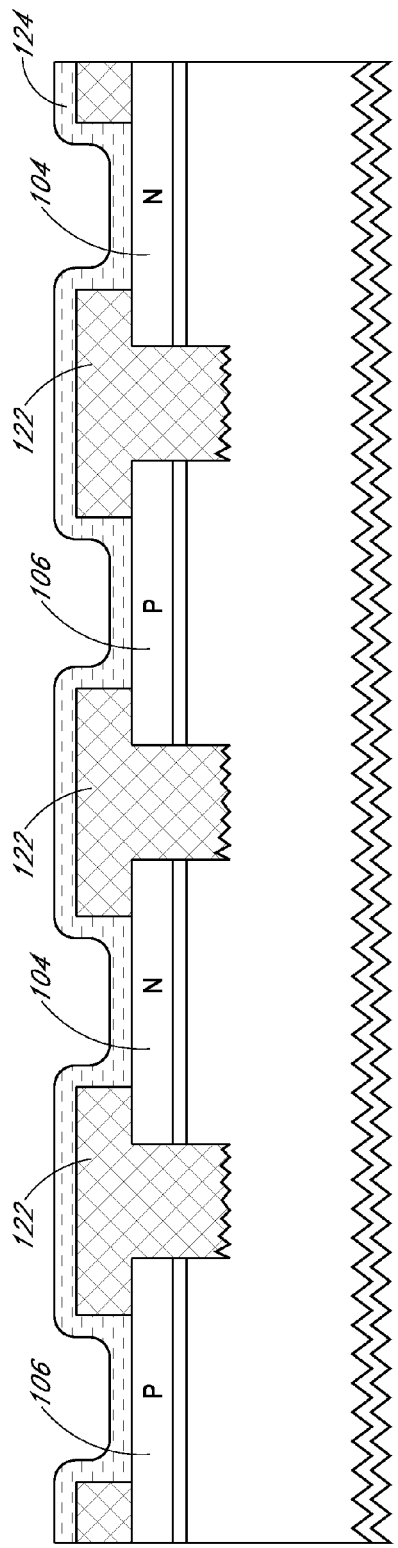

FIG. 1D illustrates a stage in solar cell fabrication following optional formation of a metal layer on the structure of FIG. 1C. Referring to FIG. 1D, a metal layer (which may be referred to as a metal seed layer, or M1 layer, for the solar cell) is formed and depicted as layer 124. In an embodiment, the metal layer 124 can be viewed as providing a plurality of metal seed material regions, with a metal seed material region on each of the alternating N-type and P-type semiconductor regions 104 and 106. That is, even though a single, uninterrupted layer may be formed on both the non-conductive material regions 122 and the alternating N-type and P-type semiconductor regions 104 and 106, regions where the metal layer 124 contact the alternating N-type and P-type semiconductor regions 104 and 106 may be viewed as a corresponding metal seed regions. In alternative embodiments, a patterned metal layer is formed to provide corresponding metal seed regions. In either case, in an embodiment, the metal layer 124 is an aluminum layer. In one particular embodiment, the aluminum layer has a thickness approximately in the range of 0.3 to 20 microns and includes aluminum in an amount greater than approximately 97 atomic % and silicon in an amount approximately in the range of 0-2 atomic %. In another particular embodiment, the aluminum layer is formed by physical vapor deposition to a thickness less than approximately 1 micron. In other embodiments, the metal layer 124 includes a metal such as, but not limited to, nickel, silver, cobalt or tungsten.

FIG. 1E illustrates a stage in solar cell fabrication following positioning (or locating or fitting up) of a metal foil on the structure of FIG. 1D. Referring to FIG. 1E and again to corresponding operation 202 of flowchart 200, a metal foil 126 is located with the alternating N-type and P-type semiconductor regions 104 and 106. In the embodiment shown, the metal foil 126 is placed on the metal layer 124.

In an embodiment, metal foil 126 is an aluminum (Al) foil having a thickness approximately in the range of 5-100 microns and, preferably, a thickness of less than approximately in the range of 50 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated).

It is to be appreciated that, in accordance with another embodiment, a seedless (124 metal layer-free) approach may be implemented. In such an approach, the metal foil 126 is ultimately adhered directly to the material of the alternating N-type and P-type semiconductor regions 104 and 106, as is described in greater detail below in association with FIG. 3. For example, in one embodiment, the metal foil 126 is located with (and then ultimately adhered directly to) alternating N-type and P-type polycrystalline silicon regions.

FIG. 1F illustrates a stage in solar cell fabrication following patterning of the metal foil of the structure of FIG. 1E. Referring to FIG. 1F and corresponding operation 206 of flowchart 200, a laser ablating process 130 is performed through the metal foil 126 in alignment with the locations between the alternating N-type and P-type semiconductor regions 104 and 106 to isolate regions of remaining metal foil 126 in alignment with the alternating N-type and P-type semiconductor regions 104 and 106. In an optional embodiment, the non-conductive material regions 122 act as a laser stop during the laser ablating 130, as is depicted in FIG. 1F.

Referring again to FIG. 1F and to corresponding operation 204 of flowchart 200, the metal foil 126 is also laser welded to the metal layer 124. The laser welding forms weld regions 128. In one such embodiment, the weld regions 128 are formed at locations above the alternating N-type and P-type semiconductor regions 104 and 106, as is depicted in FIG. 1F. In an embodiment, as described in association with FIG. 1D, a metal seed material region (e.g., as metal layer 124) is provided on each of the alternating N-type and P-type semiconductor regions 104 and 106. In that embodiment, the metal foil 126 is welded to the alternating N-type and P-type semiconductor regions 104 and 106 by laser welding the metal foil 126 the plurality of metal seed material regions 124 via weld regions 128, as is depicted in FIG. 1F.

In an embodiment, referring again to FIG. 1F and collectively to operations 204 and 206 of flowchart 200, the laser welding and the foil patterning are performed at the same time. In one such embodiment, the laser ablating through at least a portion of the metal foil 126 (patterning) involves laser ablating through an entire thickness of the metal foil, as is depicted in FIG. 1F. In another embodiment, the laser ablating through at least a portion of the metal foil 126 (patterning) involves laser ablating through only a portion of the metal foil 126, the portion having a thickness approximately in the range of 80-99% of an entire thickness of the metal foil 126, an example of which is described below in association with FIG. 7B. In a specific example of the latter embodiment, subsequent to patterning the metal foil 126, the remaining metal foil is etched to isolate regions of the remaining metal foil in alignment with the alternating N-type and P-type semiconductor regions. In another specific example, of the latter embodiment, subsequent to patterning the metal foil 126, the remaining metal foil is anodized to isolate regions of the remaining metal foil in alignment with the alternating N-type and P-type semiconductor regions. Both examples are described in greater detail below.

In an embodiment, referring again to FIG. 1F, simultaneous or near simultaneous laser welding and laser patterning of the metal foil 126 is performed by impinging an incident laser beam on the metal foil 126. In a first such embodiment, the incident laser beam has a beam shape with an inner region of lower intensity and an outer region of higher intensity, the inner region and the outer region relative to a central axis of the incident laser beam, as is described in association with FIGS. 4, 5A and 5B. In that embodiment, laser welding of the metal foil 126 to the alternating N-type and P-type semiconductor regions 104/106 is achieved with the inner region of the incident laser beam. Meanwhile, patterning of the metal foil 126 is achieved by laser ablating with the outer region of the incident laser beam through at least a portion of the metal foil 126 at regions in alignment with locations between the alternating N-type and P-type semiconductor regions 104 and 106.

Figure 6:
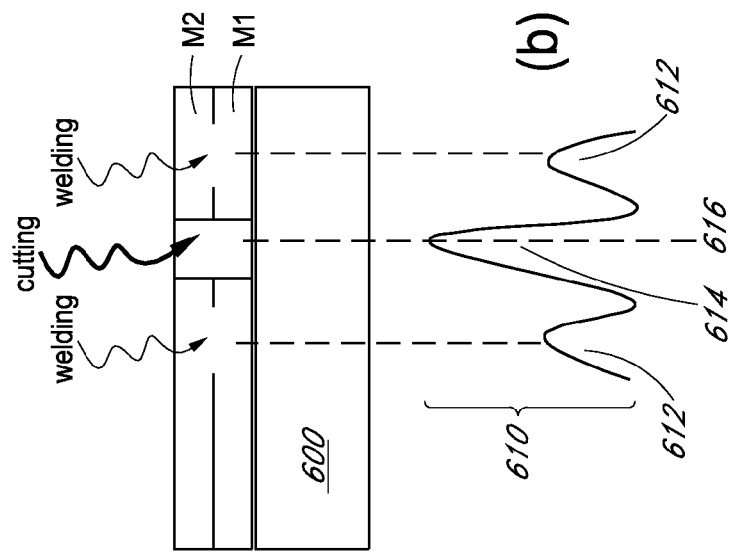
FIG. 6 is a schematic illustrating a cross-sectional view of a spatially shaped laser beam having a beam shape with an inner region of higher intensity and an outer region of lower intensity, in accordance with an embodiment of the present disclosure.
Figure 6:
Figure 6:
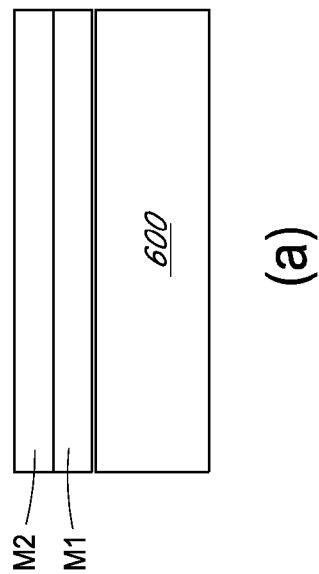

In a second such embodiment, the incident laser beam has a beam shape with an inner region of higher intensity and an outer region of lower intensity, the inner region and the outer region relative to a central axis of the incident laser beam, as is described in association with FIG. 6. In that embodiment, laser welding of the metal foil 126 to the alternating N-type and P-type semiconductor regions 104/106 is achieved with the outer region of the incident laser beam. Meanwhile, patterning of the metal foil 126 is achieved by laser ablating with the inner region of the incident laser beam through at least a portion of the metal foil 126 at regions in alignment with locations between the alternating N-type and P-type semiconductor regions 104 and 106.

In either case, in an embodiment, impinging the incident laser beam on the metal foil 126 involves generating a laser beam a laser cavity as already having one of the above described beam shapes. In another embodiment, however, impinging the incident laser beam on the metal foil 126 involves shaping an already generated laser beam to have one of the above described beam shapes using optical diffraction.

Figure 3:
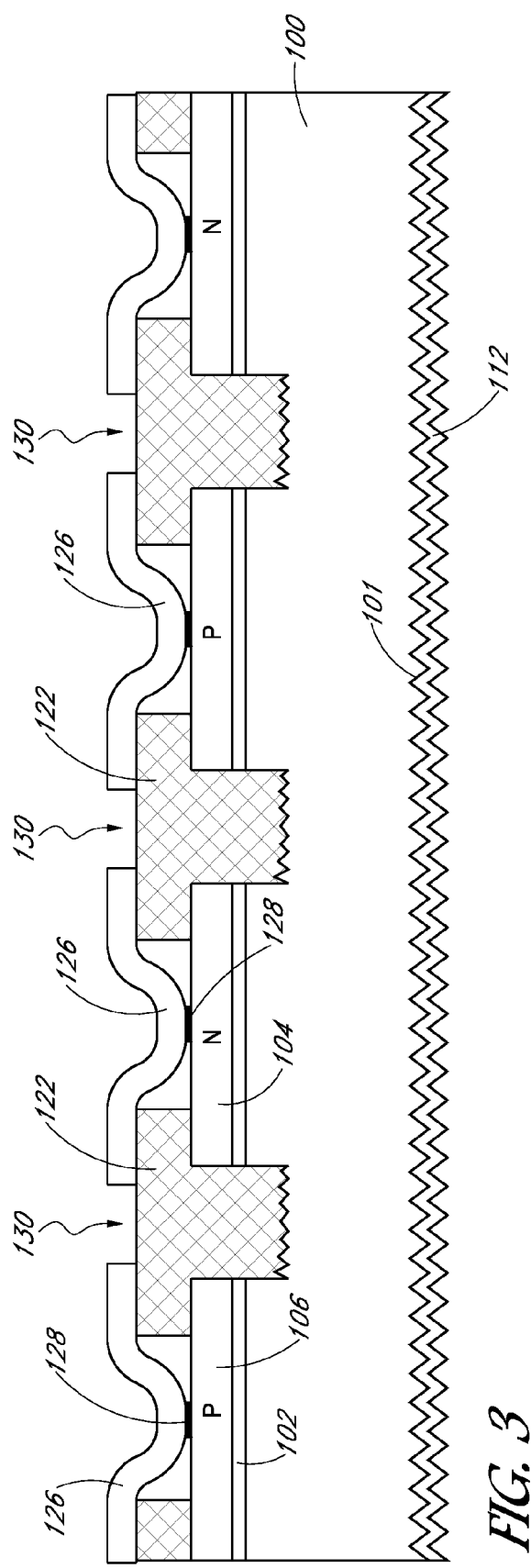
FIG. 3 illustrates a cross-sectional views of another solar cell having foil-based metallization, in accordance with another embodiment of the present disclosure.

As described above, in another embodiment, a metal layer 124 (that is, a metal seed) is not formed. As an example, FIG. 3 illustrates a cross-sectional views of another solar cell having foil-based metallization, in accordance with another embodiment of the present disclosure. Referring to FIG. 3, the metal foil 126 is laser welded (e.g., by laser welds 128) directly to the alternating N-type and P-type semiconductor regions 104 and 106. In one such embodiment, in that case that non-conductive material regions 122 are included, the metal foil comes in direct contact with the non-conductive material regions 122.

Embodiments described herein include fabrication of a solar cell according to one or more of the above described approaches. Referring to FIGS. 1F and 3, in an embodiment, a solar cell includes a substrate 100. A plurality of alternating N-type 104 and P-type 106 semiconductor regions is disposed in (not shown) or above (as shown) the substrate 100. A plurality of non-conductive material regions 122 may be included in alignment with locations between the alternating N-type and P-type semiconductor regions 104 and 106. A plurality of conductive contact structures is electrically connected to the plurality of alternating N-type and P-type semiconductor regions 104 and 106. Each conductive contact structure includes a metal foil portion 126 disposed above and in alignment with a corresponding one of the alternating N-type and P-type semiconductor regions 104 and 106.

In a specific embodiment, referring particularly to FIG. 1F, each conductive contact structure further includes a metal seed layer 124 disposed directly between the corresponding one of the alternating N-type and P-type semiconductor regions 104 and 106 and the metal foil portion 126. In another specific embodiment, referring particularly to FIG. 3, the metal seed layer 124 is not included and the metal foil portion 126 is welded directly to the corresponding one of the alternating N-type and P-type semiconductor regions 104 and 106.

Figure 4:
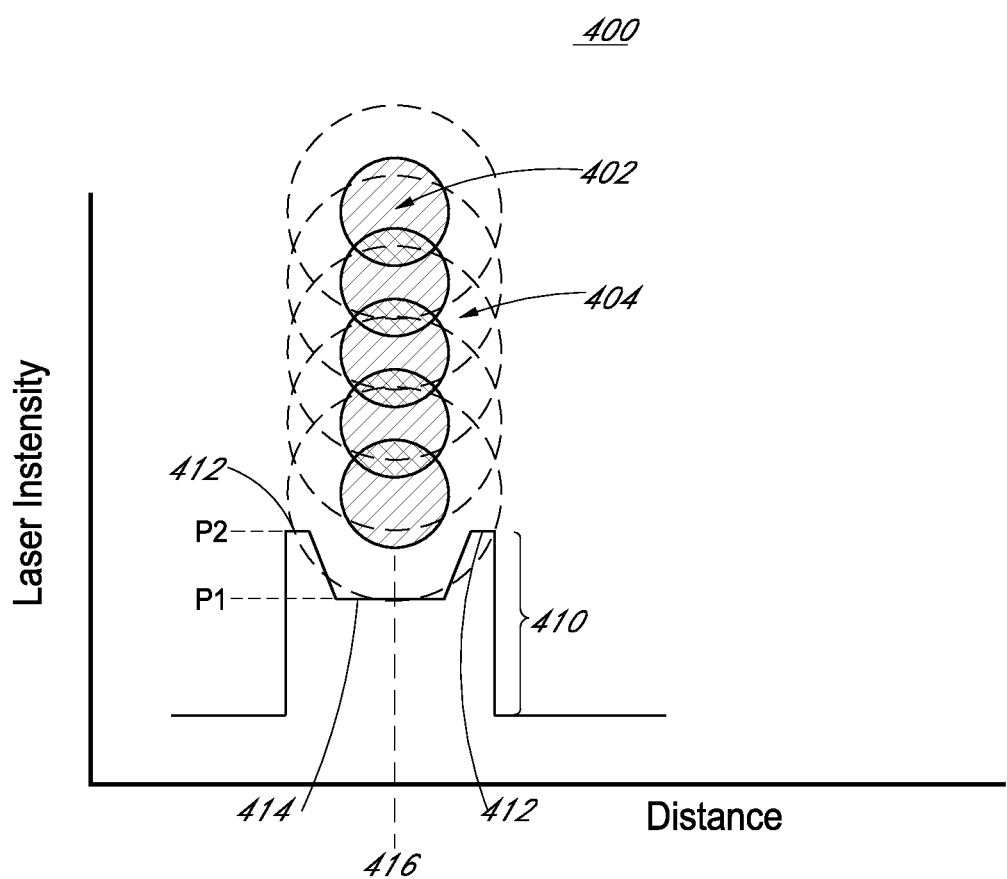
FIG. 4 is a plot of laser intensity as a function of distance illustrating a cross-sectional view of a spatially shaped laser beam having a beam shape with an inner region of lower intensity and an outer region of higher intensity, in accordance with an embodiment of the present disclosure.

As described above, a laser beam may be spatially shaped according to the first exemplary embodiment of FIG. 1F. FIG. 4 is a plot 400 of laser intensity as a function of distance illustrating a cross-sectional view of a spatially shaped laser beam having a beam shape with an inner region of lower intensity and an outer region of higher intensity, in accordance with an embodiment of the present disclosure.

Referring to FIG. 4, a laser beam profile 410 for a beam incident on a metal foil has an inner region 414 of lower intensity and an outer region 412 of higher intensity. The inner region 414 and the outer region 412 are taken as relative to a central axis 416 of the incident laser beam. In one such embodiment, the beam profile 410 has two outer regions 412, as is depicted in FIG. 4. In an embodiment, laser welding of a metal foil to alternating N-type and P-type semiconductor regions (or to a metal M1 layer thereon) is achieved along pathway 402 using the inner region 414 of the incident laser beam 410. Patterning of the metal foil is achieved at the same time as the laser welding by laser ablating along pathway 404 with the outer regions 412 of the incident laser beam 410.

Figure 5A:
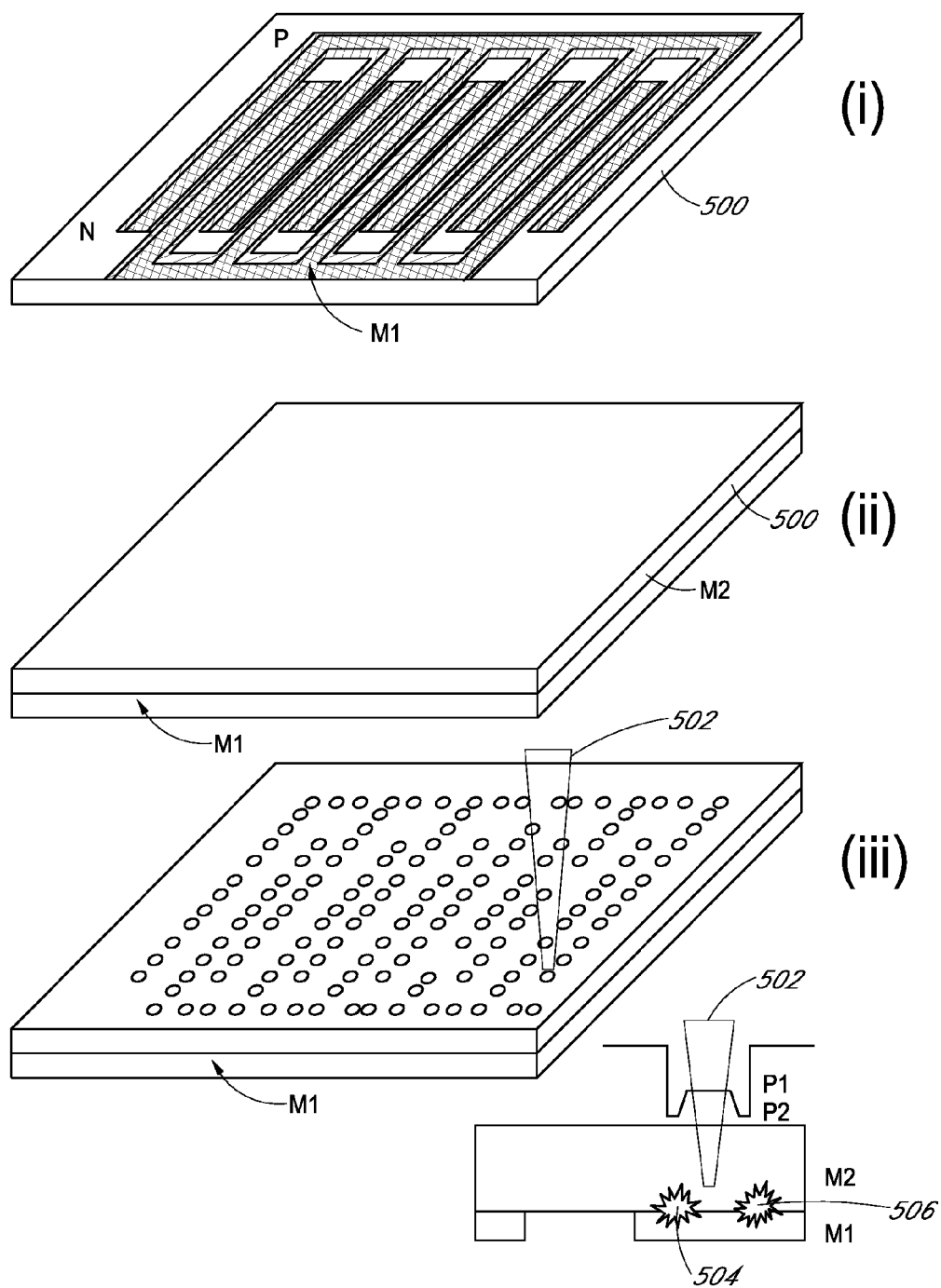
FIGS. 5A and 5B illustrate various processing operations in a method of fabricating a solar cell using the laser beam profile of FIG. 4, in accordance with an embodiment of the present disclosure.
Figure 5B:
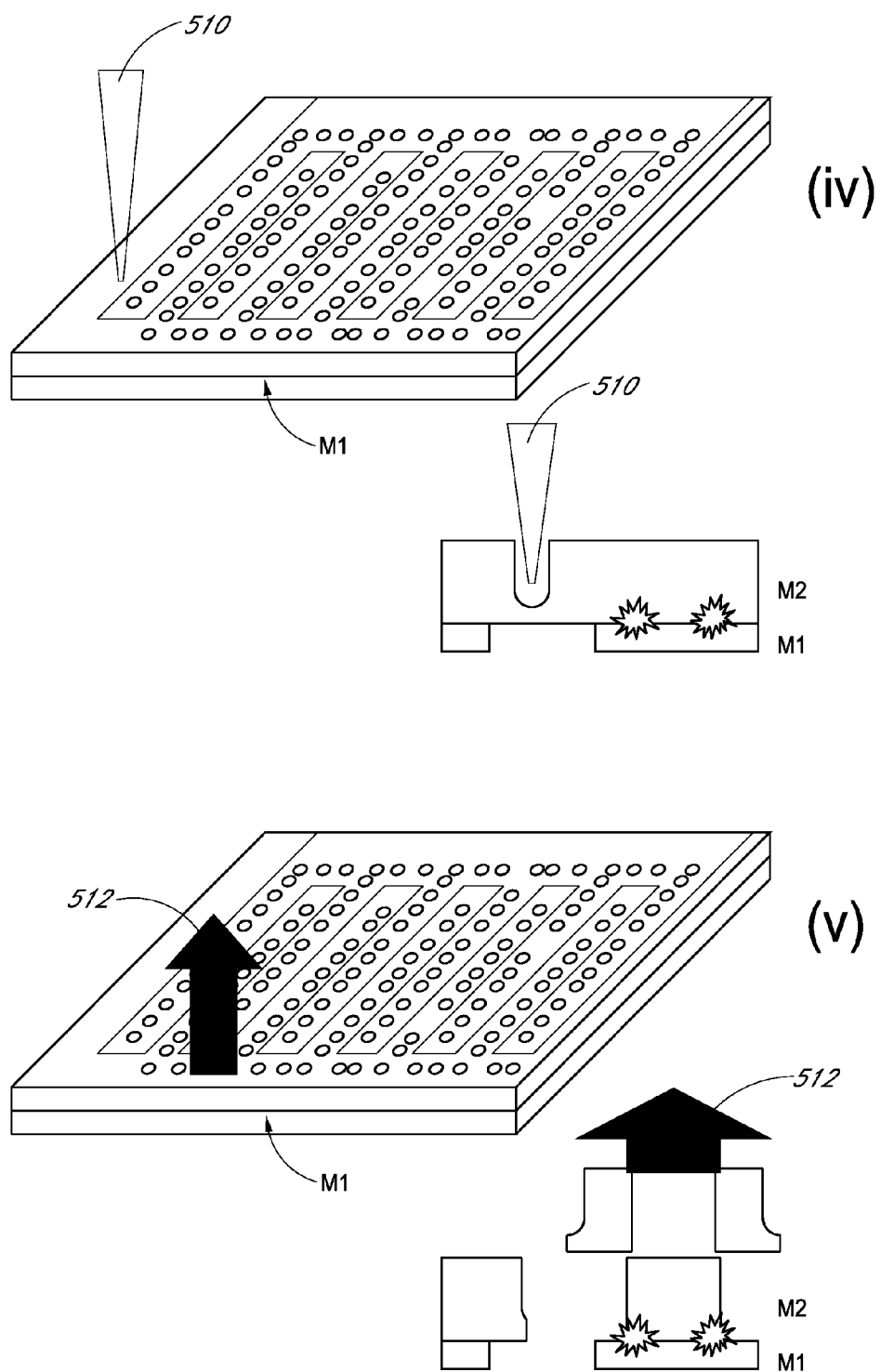

FIGS. 5A and 5B illustrate various processing operations in a method of fabricating a solar cell using the laser beam profile of FIG. 4, in accordance with an embodiment of the present disclosure.

Referring to part (i) of FIG. 5A, a M1 seed conductive layer is formed on N-type and P-type emitter regions above a solar cell substrate 500, i.e. on the device side of a solar cell, and is patterned or is formed as patterned. Referring to part (ii) of FIG. 5A, an M2 layer is located on the M1/cell pairing with direct contact maintained as suitable for laser welding. Referring to part (iii) of FIG. 5A, a highly energetic beam 502 is applied to locally heat the M2 layer and bond M1 and M2. The spacing between weld spot may be optimized for the adhesion and the patterning operation. In one embodiment, the highly energetic beam is a long pulse duration, e.g., greater than 100 μs, laser or electron beam. Referring again to part (iii) of FIG. 5A, the inner portion of the laser beam 502 is used to form a weld spot 504. The outer portion of the laser beam 502 is used to weaken a M1 to device bond. In an embodiment, the outer portion of the laser beam 502 is used to cut the M2 layer while the inner region of the beam is used to weld the M2 layer.

Referring to part (iv) of FIG. 5B, in an optional embodiment, another laser 510, e.g., of shorter pulse duration, less than 1 μs, is applied to fabricate a guiding groove line for ultimate tear-off patterning. In that embodiment, referring to part (v) of FIG. 5B, one end of the unwelded foil may be gripped 512 and peeled off, such that the weakened (and laser grooved) portion is peeled off while leaving the welded region of the foil to remain on the cell.

As is described above, a laser beam may be spatially shaped according to the second exemplary embodiment of FIG. 1F. FIG. 6 is a schematic illustrating a cross-sectional view of a spatially shaped laser beam having a beam shape with an inner region of higher intensity and an outer region of lower intensity, in accordance with an embodiment of the present disclosure.

Referring to part (a) of FIG. 6, a substrate 600 has a metal 1 (M1) and metal 2 (M2) thereon. Referring to part (b) of FIG. 6, a laser beam profile 610 for a beam incident on a metal foil (M2) has an inner region 614 of higher intensity and an outer region 612 of lower intensity. The inner region 614 and the outer region 612 are taken as relative to a central axis 616 of the incident laser beam 610. In one such embodiment, the beam profile 610 has two outer regions 612, as is depicted in FIG. 6. In an embodiment, laser welding (welding) of a metal foil (M2) to alternating N-type and P-type semiconductor regions (or to a metal M1 layer thereon) is achieved using the outer regions 612 of the incident laser beam 610. Patterning (cutting) of the metal foil (M2) is achieved at the same time as the laser welding by laser ablating with the inner region 614 of the incident laser beam 610.

As described briefly above, as an alternative to the embodiment depicted in FIG. 1F, initial yet incomplete patterning of a metal foil in contact with emitter regions of a solar cell may be performed using a lasing ablation process. The patterning is then completed in a subsequent process operation. As an example, FIGS. 7A and 7B illustrate cross-sectional views of various stages in the fabrication of a solar cell using foil-based metallization, in accordance with another embodiment of the present disclosure.

Referring to FIG. 7A, a plurality of alternating N-type and P-type semiconductor regions are formed above a substrate. In particular, a substrate 700 has disposed there above N-type semiconductor regions 704 and P-type semiconductor regions 706 disposed on a thin dielectric material 702 as an intervening material between the N-type semiconductor regions 704 or P-type semiconductor regions 706, respectively, and the substrate 700. The substrate 700 has a light-receiving surface 701 opposite a back surface above which the N-type semiconductor regions 704 and P-type semiconductor regions 706 are formed.

In an embodiment, the substrate 700 is a monocrystalline silicon substrate, such as a bulk single crystalline N-type doped silicon substrate. It is to be appreciated, however, that substrate 700 may be a layer, such as a multi-crystalline silicon layer, disposed on a global solar cell substrate. In an embodiment, the thin dielectric layer 702 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer.

In an embodiment, the alternating N-type and P-type semiconductor regions 704 and 706, respectively, are formed from polycrystalline silicon formed by, e.g., using a plasma-enhanced chemical vapor deposition (PECVD) process. In one such embodiment, the N-type polycrystalline silicon emitter regions 704 are doped with an N-type impurity, such as phosphorus. The P-type polycrystalline silicon emitter regions 706 are doped with a P-type impurity, such as boron. As is depicted in FIG. 7A, the alternating N-type and P-type semiconductor regions 704 and 706 may have trenches 708 formed there between, the trenches 708 extending partially into the substrate 700. Additionally, in one embodiment, a bottom anti-reflective coating (BARC) material 710 or other protective layer (such as a layer amorphous silicon) is formed on the alternating N-type and P-type semiconductor regions 704 and 706, as is depicted in FIG. 7A.

In an embodiment, the light receiving surface 701 is a texturized light-receiving surface, as is depicted in FIG. 7A. In one embodiment, a hydroxide-based wet etchant is employed to texturize the light receiving surface 701 of the substrate 700 and, possibly, the trench 708 surfaces as is also depicted in FIG. 7A. It is to be appreciated that the timing of the texturizing of the light receiving surface may vary. For example, the texturizing may be performed before or after the formation of the thin dielectric layer 702. In an embodiment, a texturized surface may be one which has a regular or an irregular shaped surface for scattering incoming light, decreasing the amount of light reflected off of the light receiving surface 701 of the solar cell. Referring again to FIG. 7A, additional embodiments can include formation of a passivation and/or anti-reflective coating (ARC) layers (shown collectively as layer 712) on the light-receiving surface 701. It is to be appreciated that the timing of the formation of passivation and/or ARC layers may also vary.

Referring again to FIG. 7A, a plurality of metal seed material regions 714 is formed to provide a metal seed material region on each of the alternating N-type and P-type semiconductor regions 704 and 706, respectively. The metal seed material regions 714 make direct contact to the alternating N-type and P-type semiconductor regions 704 and 706. In an embodiment, the metal seed regions 714 are aluminum regions. In one such embodiment, the aluminum regions each have a thickness approximately in the range of 0.3 to 20 microns and include aluminum in an amount greater than approximately 97% and silicon in an amount approximately in the range of 0-2%. In other embodiments, the metal seed regions 714 include a metal such as, but not limited to, nickel, silver, cobalt or tungsten. Optionally, a protection layer may be included on the plurality of metal seed material regions 714. In a particular embodiment, an insulating layer 716 is formed on the plurality of metal seed material regions 714. In an embodiment, the insulating layer 716 is a silicon nitride or silicon oxynitride material layer. In another embodiment, in place of the metal seed regions 714, a blanket metal seed layer is used that is not patterned at this stage of processing. In that embodiment, the blanket metal seed layer may be patterned in a subsequent etching process, such as a hydroxide-based wet etching process.

Referring again to FIG. 7A, a metal foil 718 is located with the alternating N-type and P-type semiconductor regions. In an embodiment, the metal foil 718 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil.

It is to be appreciated that, in accordance with another embodiment of the present disclosure, a seedless approach may be implemented. In such an approach, metal seed material regions 714 are not formed, and the metal foil 718 is located with the material of the alternating N-type and P-type semiconductor regions 704 and 706. For example, in one embodiment, the metal foil 718 is located directly with alternating N-type and P-type polycrystalline silicon regions.

Referring to FIG. 7B, the metal foil 718 is directly coupled with a corresponding portion of each of the metal seed material regions 714. In one such embodiment, the direct coupling of portions of the metal foil 718 with a corresponding portion of each of the metal seed material regions 714 involves forming a metal weld 720 at each of such locations, as is depicted in FIG. 7B. In an embodiment, the metal foil 718 is adhered directly to the plurality of metal seed material regions 714 by using a laser welding process. In an embodiment, the optional insulating layer 716 is included, and adhering the metal foil 718 to the plurality of metal seed material regions 714 involves breaking through regions of the insulating layer 716, as is depicted in FIG. 7B.

FIG. 7B further illustrates the structure of FIG. 7A following formation of laser grooves in the metal foil. Referring again to FIG. 7B, the metal foil 718 is laser ablated through only a portion of the metal foil 718 at regions corresponding to locations between the alternating N-type and P-type semiconductor regions 704 and 706, e.g., above trench 708 locations as is depicted in FIG. 7B. The laser ablating forms grooves 730 that extend partially into, but not entirely through, the metal foil 718. In an embodiment, forming laser grooves 730 involves laser ablating a thickness of the metal foil 718 approximately in the range of 80-99% of an entire thickness of the metal foil 718. That is, in one embodiment, it is critical that the lower portion of the metal foil 718 is not penetrated, such that metal foil 718 protects the underlying emitter structures. In an embodiment, the laser welding and the laser ablation of FIG. 7B are performed at the same time using a spatially shaped laser as described above.

In a first exemplary embodiment, the remaining metal foil 718 is subsequently anodized at exposed surfaces thereof to isolate regions 740 of the remaining metal foil 718 corresponding to the alternating N-type and P-type semiconductor regions 704 and 706. In particular, the exposed surfaces of the metal foil 718, including the surfaces of the grooves 730, are anodized to form an oxide coating. At locations corresponding to the alternating N-type and P-type semiconductor regions 704 and 706, e.g., in the grooves 730 at locations above the trenches 708, the entire remaining thickness of the metal foil 718 is anodized there through to isolate regions 740 of metal foil 718 remaining above each of the N-type and P-type semiconductor regions 704 and 706.

In a second exemplary embodiment, instead of anodizing the metal foil 718 to isolate portions of the metal foil 718, the patterned metal foil 718 is etched to isolate portions 740 of the metal foil 718. In one such embodiment, the structure of FIG. 7B is exposed to a wet etchant. Although the wet etchant etches all exposed portions of the metal foil 718, a carefully timed etch process is used to break through the bottoms of the laser grooves 730 without significantly reducing the thickness of the non-grooved regions 740 of the metal foil 718. In a particular embodiment, a hydroxide based etchant is used, such as, but not limited to, potassium hydroxide (KOH) or tetramethylammonium hydroxide (TMAH).

Although certain materials are described specifically with reference to above described embodiments, some materials may be readily substituted with others with other such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, approaches for foil-based metallization of solar cells and the resulting solar cells have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
    locating a metal foil above a plurality of alternating N-type and P-type semiconductor regions disposed in or above a substrate;
    laser welding the metal foil to the alternating N-type and P-type semiconductor regions; and
    patterning the metal foil by laser ablating through at least a portion of the metal foil at regions in vertical alignment with locations on the border between adjacent ones of the alternating N-type and P-type semiconductor regions, the laser welding and the patterning performed at the same time with the same laser beam.

2. The method of claim 1, wherein laser ablating through at least a portion of the metal foil comprises laser ablating through an entire thickness of the metal foil.

3. The method of claim 1, wherein laser ablating through at least a portion of the metal foil comprises laser ablating through only a portion of the metal foil, the portion having a thickness in the range of 80-99% of an entire thickness of the metal foil.

4. The method of claim 3, further comprising:
    subsequent to patterning the metal foil, etching the remaining metal foil to isolate regions of the remaining metal foil in alignment with the alternating N-type and P-type semiconductor regions.

5. The method of claim 3, further comprising:
    subsequent to patterning the metal foil, anodizing the remaining metal foil to isolate regions of the remaining metal foil in alignment with the alternating N-type and P-type semiconductor regions.

6. The method of claim 1, further comprising:
    prior to locating the metal foil, forming a plurality of metal seed material regions to provide a metal seed material region on each of the alternating N-type and P-type semiconductor regions, wherein laser welding the metal foil to the alternating N-type and P-type semiconductor regions comprises laser welding the metal foil to the plurality of metal seed material regions.

7. The method of claim 6,
    wherein forming the plurality of metal seed material regions comprises forming aluminum regions each having a thickness in the range of 0.3 to 20 microns and comprising aluminum in an amount greater than 97 atomic and silicon in an amount in the range of 0-2 atomic %, wherein laser welding the metal foil comprises laser welding an aluminum foil having a thickness in the range of 5-100 microns.

8. The method of claim 1, further comprising:
    forming the plurality of alternating N-type and P-type semiconductor regions by forming alternating N-type and P-type regions in a polycrystalline silicon layer formed above the substrate, and forming a trench between each of the alternating N-type and P-type regions in the polycrystalline silicon layer, the trenches extending partially into the substrate.

9. A method of fabricating a solar cell, the method comprising:
   locating a metal foil above a plurality of alternating N-type and P-type semiconductor regions disposed in or above a substrate;
   impinging an incident laser beam on the metal foil, the incident laser beam comprising a beam shape having an inner region of lower intensity and an outer region of higher intensity, the inner region and the outer region relative to a central axis of the incident laser beam;
   laser welding the metal foil to the alternating N-type and P-type semiconductor regions with the inner region of the incident laser beam; and
   patterning the metal foil by laser ablating with the outer region of the incident laser beam through at least a portion of the metal foil at regions in vertical alignment with locations on the border between adjacent ones of the alternating N-type and P-type semiconductor regions.

10. The method of claim 9, wherein impinging the incident laser beam on the metal foil comprises generating a laser beam having the beam shape from a laser cavity.

11. The method of claim 9, wherein impinging the incident laser beam on the metal foil comprises shaping a laser beam to have the beam shape using optical diffraction.

12. The method of claim 9, wherein laser ablating through at least a portion of the metal foil comprises laser ablating through an entire thickness of the metal foil.

13. The method of claim 9, wherein laser ablating through at least a portion of the metal foil comprises laser ablating through only a portion of the metal foil, the portion having a thickness in the range of 80-99% of an entire thickness of the metal foil.

14. A method of fabricating a solar cell, the method comprising:
   locating a metal foil above a plurality of alternating N-type and P-type semiconductor regions disposed in or above a substrate;
   impinging an incident laser beam on the metal foil, the incident laser beam comprising a beam shape having an inner region of higher intensity and an outer region of lower intensity, the inner region and the outer region relative to a central axis of the incident laser beam;
   laser welding the metal foil to the alternating N-type and P-type semiconductor regions with the outer region of the incident laser beam; and
   patterning the metal foil by laser ablating with the inner region of the incident laser beam through at least a portion of the metal foil at regions in vertical alignment with locations on the border between adjacent ones of the alternating N-type and P-type semiconductor regions.

15. The method of claim 14, wherein impinging the incident laser beam on the metal foil comprises generating a laser beam having the beam shape from a laser cavity.

16. The method of claim 14, wherein impinging the incident laser beam on the metal foil comprises shaping a laser beam to have the beam shape using optical diffraction.

17. The method of claim 14, wherein laser ablating through at least a portion of the metal foil comprises laser ablating through an entire thickness of the metal foil.

18. The method of claim 14, wherein laser ablating through at least a portion of the metal foil comprises laser ablating through only a portion of the metal foil, the portion having a thickness in the range of 80-99% of an entire thickness of the metal foil.

\* \* \* \* \*